United States Patent
Leal et al.

(10) Patent No.: US 9,640,469 B2
(45) Date of Patent: May 2, 2017

(54) MATRIX LID HEATSPREADER FOR FLIP CHIP PACKAGE

(71) Applicants: George R. Leal, Cedar Park, TX (US); Tim V. Pham, Austin, TX (US)

(72) Inventors: George R. Leal, Cedar Park, TX (US); Tim V. Pham, Austin, TX (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 14/850,070

(22) Filed: Sep. 10, 2015

(65) Prior Publication Data

US 2016/0005682 A1 Jan. 7, 2016

Related U.S. Application Data

(62) Division of application No. 13/618,185, filed on Sep. 14, 2012, now Pat. No. 9,159,643.

(51) Int. Cl.
*H01L 21/00* (2006.01)
*H01L 23/495* (2006.01)
(Continued)

(52) U.S. Cl.
CPC ...... *H01L 23/49568* (2013.01); *H01L 21/561* (2013.01); *H01L 21/565* (2013.01); *H01L 23/3107* (2013.01); *H01L 23/3675* (2013.01); *H01L 23/3736* (2013.01); *H01L 23/4334* (2013.01); *H01L 23/49541* (2013.01); *H01L 23/49838* (2013.01); *H01L 24/17* (2013.01); *H01L 24/32* (2013.01); *H01L 24/73* (2013.01); *H01L 24/97* (2013.01); *H01L 25/0655* (2013.01); *H01L 21/566* (2013.01); *H01L 2224/16225* (2013.01); *H01L 2224/29191* (2013.01); *H01L 2224/32225* (2013.01); *H01L 2224/32245* (2013.01); *H01L 2224/73204* (2013.01); *H01L 2224/73253* (2013.01); *H01L 2224/83191* (2013.01); *H01L 2224/83192* (2013.01); *H01L 2224/92225* (2013.01); *H01L 2224/97* (2013.01); *H01L 2924/12042* (2013.01); *H01L 2924/141* (2013.01);
(Continued)

(58) Field of Classification Search
None
See application file for complete search history.

(56) References Cited

U.S. PATENT DOCUMENTS 5,409,865 A 4/1995 Karnezos
5,909,056 A 6/1999 Mertol
(Continued)

OTHER PUBLICATIONS

D. Retuta et al., Thermal Performance Enhancement for CSP Packages, IEEE Electronic Components and Technology Conference, May 29, 2007-Jun. 1, 2007.
(Continued)

*Primary Examiner* — Reema Patel

(57) ABSTRACT

A method and apparatus are provided for manufacturing a lead frame based thermally enhanced flip chip package with an exposed heat spreader lid array (310) designed for direct attachment to an array of integrated circuit die (306) by including a thermal interface adhesion layer (308) to each die (306) and encapsulating the attached heat spreader lid array (310) and array of integrated circuit die (306) with mold compound (321) except for planar upper lid surfaces of the heat spreader lids (312).

15 Claims, 4 Drawing Sheets

(51) Int. Cl.
*H01L 23/433* (2006.01)
*H01L 21/56* (2006.01)
*H01L 23/00* (2006.01)
*H01L 23/31* (2006.01)
*H01L 23/367* (2006.01)
*H01L 23/373* (2006.01)
*H01L 23/498* (2006.01)
*H01L 25/065* (2006.01)

(52) U.S. Cl.
CPC .......... *H01L 2924/1434* (2013.01); *H01L 2924/14335* (2013.01); *H01L 2924/15311* (2013.01); *H01L 2924/17738* (2013.01); *H01L 2924/17747* (2013.01); *H01L 2924/181* (2013.01)

(56) References Cited

U.S. PATENT DOCUMENTS

| | | |
|---|---|---|
| 5,977,626 A | 11/1999 | Wang et al. |
| 5,990,552 A | 11/1999 | Xie et al. |
| 6,258,624 B1 | 7/2001 | Corisis |
| 6,432,742 B1 | 8/2002 | Guan et al. |
| 6,432,749 B1 | 8/2002 | Libres |
| 6,562,655 B1 | 5/2003 | Glenn et al. |
| 6,734,552 B2 | 5/2004 | Combs et al. |
| 6,737,755 B1 | 5/2004 | McLellan et al. |
| 6,784,535 B1 | 8/2004 | Chiu |
| 6,800,948 B1 | 10/2004 | Yeung et al. |
| 6,882,041 B1 | 4/2005 | Cheah et al. |
| 6,924,170 B2 | 8/2005 | Ravi et al. |
| 6,933,176 B1* | 8/2005 | Kirloskar ........ H01L 21/561 257/712 |
| 6,967,126 B2 | 11/2005 | Lee et al. |
| 6,977,188 B2 | 12/2005 | Takase |
| 6,979,594 B1 | 12/2005 | Fan et al. |
| 7,153,725 B2 | 12/2006 | Wang et al. |
| 7,180,173 B2 | 2/2007 | Kuo et al. |
| 7,259,445 B2 | 8/2007 | Lau et al. |
| 7,259,448 B2 | 8/2007 | Zhang et al. |
| 7,432,130 B2 | 10/2008 | Ismail et al. |
| 7,741,158 B2 | 6/2010 | Leung et al. |
| 7,790,510 B1 | 9/2010 | Zhang |
| 7,898,093 B1 | 3/2011 | Darveaux et al. |
| 7,998,791 B2 | 8/2011 | Chong et al. |
| 8,012,799 B1 | 9/2011 | Ibrahim et al. |
| 8,156,998 B2 | 4/2012 | Furman et al. |
| 2002/0084518 A1 | 7/2002 | Hasebe et al. |
| 2003/0067069 A1 | 4/2003 | Lebonheur et al. |
| 2003/0106212 A1 | 6/2003 | Chao et al. |
| 2003/0127714 A1 | 7/2003 | Behun et al. |
| 2004/0188829 A1 | 9/2004 | Hu et al. |
| 2005/0224953 A1* | 10/2005 | Lee ................ H01L 23/10 257/704 |
| 2006/0202313 A1 | 9/2006 | Tan et al. |
| 2006/0231944 A1 | 10/2006 | Huang et al. |
| 2006/0270116 A1 | 11/2006 | Dangelo |
| 2007/0075404 A1 | 4/2007 | Dimaano et al. |
| 2007/0122943 A1 | 5/2007 | Foong et al. |
| 2007/0178626 A1 | 8/2007 | Ismail et al. |
| 2007/0200225 A1 | 8/2007 | Ibrahim et al. |
| 2007/0235859 A1 | 10/2007 | Espiritu et al. |
| 2009/0219698 A1 | 9/2009 | Chao |
| 2010/0014254 A1 | 1/2010 | Fukuzono et al. |
| 2010/0109152 A1* | 5/2010 | Kariyazaki .......... H01L 23/055 257/704 |
| 2010/0323465 A1 | 12/2010 | Leung et al. |
| 2010/0327430 A1* | 12/2010 | Jadhav ............ H01L 23/3735 257/712 |
| 2011/0012257 A1 | 1/2011 | Eu et al. |
| 2011/0024906 A1 | 2/2011 | Meyer et al. |

OTHER PUBLICATIONS

Partial European Search Report for EP Application No. 13183374.1, dated Dec. 12, 2013.
Non-final office action—Restriction, dated Dec. 27, 2013 in U.S. Appl. No. 13/617,851.
Non-final office action dated Feb. 20, 2014 in U.S. Appl. No. 13/617,851.
Notice of Allowance dated Sep. 8, 2014 in U.S. Appl. No. 13/617,851.
Non-final office action—Restriction, dated Jul. 16, 2015 in U.S. Appl. No. 14/560,678.
Non-final office action dated Aug. 12, 2015 in U.S. Appl. No. 14/560,678.
Notice of Allowance dated Dec. 14, 2015 in U.S. Appl. No. 14/560,678.

* cited by examiner

MATRIX LID HEATSPREADER FOR FLIP CHIP PACKAGE

CROSS-REFERENCE TO RELATED APPLICATIONS

This application is a divisional of co-pending application Ser. No. 13/618,185, filed Sep. 14, 2012, which is incorporated herein by reference in its entirety.

BACKGROUND OF THE INVENTION

Field of the Invention

This invention relates to integrated circuit packages and a method of manufacturing same. In one aspect, the present invention relates to an integrated circuit package having a lid heat spreader.

Description of the Related Art

As the density and complexity of integrated circuit devices increases and the size of such devices shrinks, significant challenges are posed in the design and packaging of these devices. One challenge is to provide a thermal path within the package to conduct heat away from the integrated circuit die, where conventional approaches for removing heat generated within the package typically use individual metal lids or heat spreaders that are separately applied to individual packaged units and then encapsulated with molding compound. The use of individual lids is not efficient for the manufacture of multiple integrated circuits in terms of the separate application requirements for separate heat spreaders and also in forcing the use of a larger body size to allow room beyond the edge of the lid for saw singulation. Further, such packages typically have a relatively high thermal resistance between the die junction surface and the heat spreader, especially when mold compound is formed therebetween. While exposed heat spreaders have been proposed for flip-chip packaging of wire bonded integrated circuit die, such approaches present packaging reliability challenges where excess encapsulation material that encases a heat spreader lid impairs thermal transfer from the integrated circuit die, as well as fabrication inefficiencies when excess encapsulation material is removed from the heat spreader lid.

Accordingly, a need exists for an improved integrated circuit chip package and manufacture method that addresses various problems in the art that have been discovered by the above-named inventors where various limitations and disadvantages of conventional solutions and technologies will become apparent to one of skill in the art after reviewing the remainder of the present application with reference to the drawings and detailed description which follow, though it should be understood that this description of the related art section is not intended to serve as an admission that the described subject matter is prior art.

BRIEF DESCRIPTION OF THE DRAWINGS

The present invention may be understood, and its numerous objects, features and advantages obtained, when the following detailed description is considered in conjunction with the following drawings, in which.

DETAILED DESCRIPTION

Figure 1:
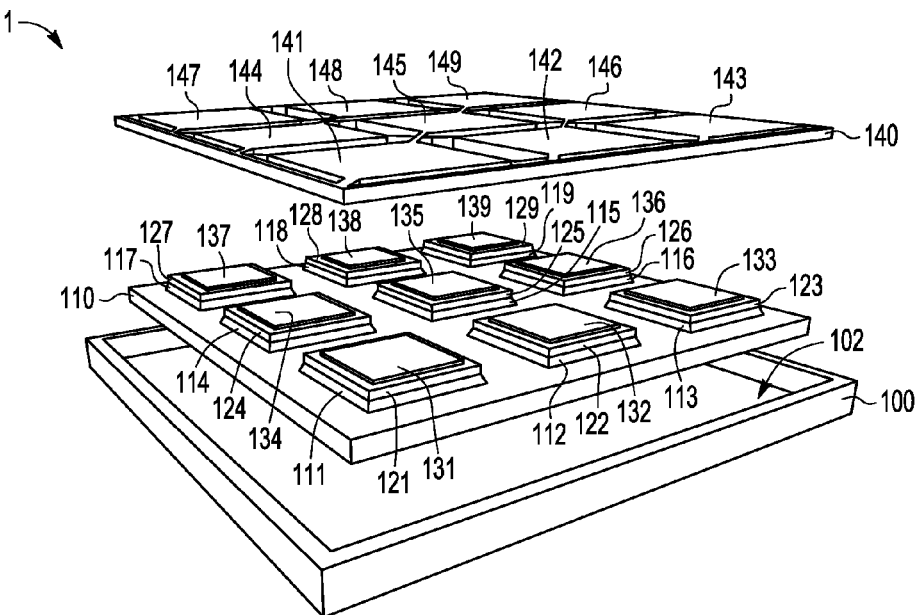
FIG. 1 illustrates a perspective view of a planar array of heat spreader lids and integrated circuit die mounted on a carrier substrate positioned over a lower mold packaging die.

A method and apparatus are described for fabricating integrated circuit chips with low profile thermally enhanced flip chip packaging having exposed heat spreader lids that may be formed as an array of flip chip packages with heatspreaders configured as an array of stamped or etched metal or other thermally conductive material which make thermal contact through a layer of thermal interface material (TIM) with the integrated circuit chips during an encapsulation process which leaves the heat spreader lids exposed prior to singulation. In selected embodiments, the heat spreader lid array is formed as a planar array of lids and connection spars which facilitate saw singulation and extend saw blade life by reducing the amount of metal being cut. In other embodiments, the heat spreader lid array is formed as an array of upset lids and downset connection spars with reduced metal in the intended saw singulation or scribe lines to facilitate saw singulation. As formed, the heat spreader lid array includes lids which are sized to maximize thermal heat transfer from the flip chip integrated circuit die assemblies. In addition, the heat spreader lid array is attached to the top surfaces of the integrated circuit die using a compliant, TIM layer having a controlled thickness and good thermal conduction properties to minimize the thermal resistance between the die and the attached heat spreader lid. The use of a compressible or compliant TIM layer on each die (alone or in combination with compliant polymer film(s) on the mold tool surface(s)), not only improves thermal conduction, but also accommodates fabrication tolerances by helping absorb any thickness variability in the height of the integrated circuit die/carrier substrate/heatspreader assemblies in relation to the mold cavity height.

Various illustrative embodiments of the present invention will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are depicted with reference to simplified perspective and cross sectional drawings of an integrated circuit package during various stages of fabrication without including every device feature or geometry in order to avoid limiting or obscuring the present invention. In addition, certain elements in the figures are illustrated for simplicity and clarity and have not necessarily been drawn to scale. It is also noted that, throughout this detailed description, certain layers of materials will be deposited, removed and otherwise processed to form the depicted packaging structures with exposed heat spreader lids. Where the specific procedures for forming such layers are not detailed below, conventional techniques to one skilled in the art for depositing, removing or otherwise forming such layers at appropriate thicknesses shall be intended. Such details are well known and not considered necessary to teach one skilled in the art of how to make or use the present invention.

Figure 2:
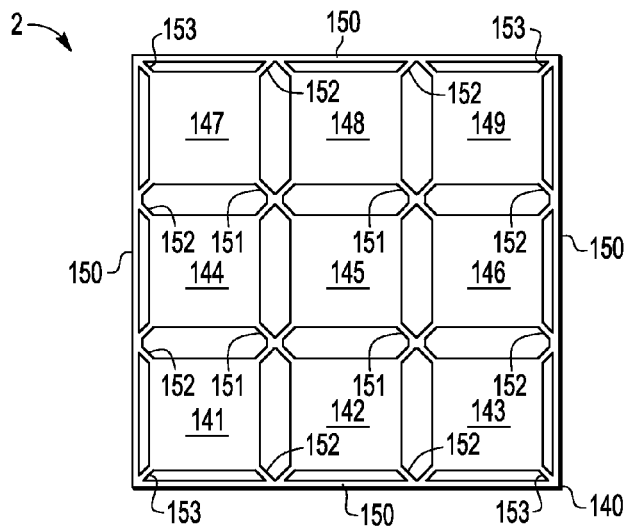
FIG. 2 illustrates a plan view of planar array of heat spreader lids shown in FIG. 1.

Referring now to FIG. 1, there is shown a perspective view 1 of a planar array of heat spreader lids 140 and an array of integrated circuit die 121-129 mounted on a carrier substrate 110 that is positioned over a lower mold packaging die tool 100. The planar array of heat spreader lids 140 may be formed as a layer of thermally conductive metal or other thermally conductive material. In selected example embodiments, the thermally conductive or heatspreader layer 140 may be formed from a copper sheet having a predetermined thickness (e.g., approximately 125-250 um) using etched or stamped leadframe manufacturing techniques known in the art. Copper and alloys thereof are suitable choices due to their high thermal conductivity and widespread use in leadframe industry, although other base materials may be used. As shown in the plan view 2 of FIG. 2, a plurality of openings are formed in the leadframe layer 140 to define an array of heat spreader lids (e.g., 141-149) connected by connection spars (e.g., 150-153). As will be appreciated, the openings in the leadframe layer 140 may be defined using any desired etching, stamping, or machining process(es). In addition, any desired connection spar pattern may be used which provides sufficient mechanical integrity to allow the array of heat spreader lids 140 to be placed on the carrier substrate 110 and into the flip chip mold cavity (e.g., die tool 100) all at once. For example, while connection spars 151-153 are shown as extending approximately diagonally from each corner of each heat spread lid 141-149 to connect with adjacent heat spreader lids or an adjacent external spar frame 150, it will be appreciated that one or more connection spars (not shown) may extend perpendicularly from the side of each heat spread lid 141-149 to connect with one another and/or the external spar frame 150. In any event, the design and placement of the connection spars effectively removes metal from the saw singulation path, thereby increasing throughput and extending saw blade life. Also, the shape of each heat spreader lids may differ in shape from the square shapes shown in FIG. 2.

The carrier substrate panel 110 includes a plurality of integrated circuit die 121-129 arranged in a matrix array, where the carrier substrate panel 110 is positioned in registry with the planar array of heat spreader lids 140 for encapsulation molding in the lower mold packaging die tool 100. (For clarity, the top mold die/cavity is not shown in FIG. 1, but would be used when compressing the array of heat spreader lids 140 into contact with the array of die 121-129. As illustrated, each of the integrated circuit die 121-129 is attached to the carrier substrate panel 110 and secured by patterned underfill 111-119 formed between the die 121-129 and the carrier substrate panel 110. Though not explicitly shown, it will be appreciated that each die 121-129 is electrically connected to conductors in the carrier substrate panel 110 using an appropriate substrate-to-die interconnect mechanism, such as flip chip bonding. In addition, each integrated circuit die 121-129 on the carrier substrate panel 110 also includes a patterned thermal interface material (TIM) layer 131-139 formed on an upper or exposed surface of the integrated circuit die. In selected embodiments, the TIM layers (e.g., 131-139) may be formed with a compliant, thermally conductive grease or non-curing silicon material to minimize the thermal resistance between the die and the heat spreader lids 141-149, and to protect the die from damage during any compression in the encapsulation process when the carrier substrate panel 110 and array of heat spreader lids 140 are lowered into the cavity opening 102 in the lower mold packaging die tool 100 for encapsulation molding, such as cavity injection molding which involves dispensing liquid or powdered mold compound into the cavity opening 102. In other embodiments, the thermal interface material or TIM (131-139) can be applied to the bottom surface of each heatspreader (141-149) as dispensed grease or as a tape or film layer still acting as a compliant layer to aid manufacturability.

Figure 3:
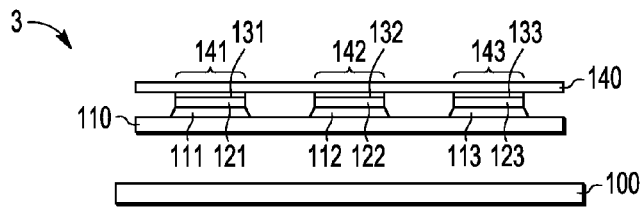
FIG. 3 illustrates a side view of the planar array of heat spreader lids affixed to the integrated circuit die mounted on the carrier substrate prior to placement in the lower mold packaging die.

As illustrated in the side view 3 of FIG. 3, the planar heat spreader lid array 140 is affixed to the integrated circuit die (e.g., 121-123) which are die attached (e.g., 111-113) on the carrier substrate 110 for placement in the lower mold packaging die 100. At this point in the fabrication process, the TIM layer (e.g., 131-133) is positioned on each die (e.g., 121-123) to provide direct thermal contact between the die and the corresponding heat spreader lid (e.g., 141-143) once the carrier substrate panel 110 is compressed into contact with the array of heat spreader lids 140. In addition, the lateral dimensions of each heat spreader lid (e.g., 141-143) in the array 140 will determine the extent to which the heat spreader lids (e.g., 141-143) overlap with the corresponding integrated circuit die (e.g., 121-123). In selected embodiments, the lateral dimensions of each heat spreader lid may be selected to completely cover the entire upper surface of the corresponding integrated circuit die. In other embodiments, the lateral dimensions of the heatspreader may be substantially equivalent to the final package size after singulation.

Figure 4:
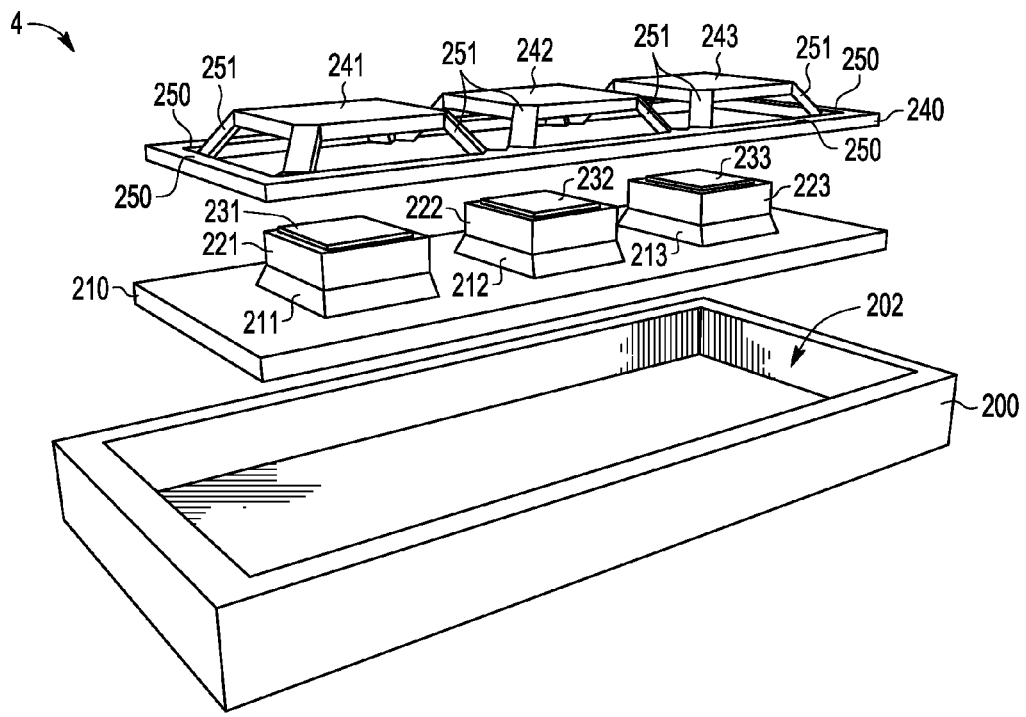
FIG. 4 illustrates a perspective view of an array of upset/downset heat spreader lids and integrated circuit die mounted on a carrier substrate positioned over a lower mold packaging die.

Turning now to FIG. 4, there is shown a perspective view 4 of a non-planar array of upset heat spreader lids 240 which is positioned in registry with an array of integrated circuit die 221-223 that is flip chip mounted and underfilled (e.g., 211-213) to a carrier substrate 210 that is positioned over a lower mold packaging die tool 200. The depicted heat spreader lid array 240 may be formed using any desired leadframe fabrication techniques. For example, a layer of copper or other thermally conductive material having a predetermined thickness may be etched, stamped, or otherwise machined to form openings defining an array of heat spreader lids (e.g., 241-243) connected by spars 251 to an external spar frame 250, and then the heatspreader portion may be upset to be non-planar with spars. Again, any desired connection spar pattern and perimeter frame may be used which provides sufficient mechanical integrity to allow the array of heat spreader lids 240 to be placed over the carrier substrate 210 and into the mold cavity (e.g., die tool 200) all at once. In this way, the design and placement of the connection spars effectively removes metal from the saw singulation path, thereby increasing throughput of saw singulation and extending saw blade life. In addition, with the spars now fully encapsulated within the mold compound, the formation of burrs during singulation is minimized while still enabling an exposed heatspreader.

On the carrier substrate 210, an array of integrated circuit die 221-223 are flip chip attached and underfilled (e.g., 211-213) to form interconnects between the die 221-223 and the carrier substrate panel 210. In addition, one or more bumps on each die 221-223 may be electrically connected to conductors or pads in the carrier substrate panel 210 using the flip chip interconnect method (not shown). In order to enhance heat dissipation, each integrated circuit die 221-223 on the carrier substrate panel 210 includes a patterned thermal interface material (TIM) layer 231-233 formed on an upper or exposed surface of the integrated circuit die. The patterned TIM layers 231-233 may be formed to a predetermined thickness or volume that provides good thermal conduction and compression flexibility. For example, TIM layers 231-233 formed to a predetermined thickness that is less than 50-75 um will provide good thermal conduction between the die 221-223 and the heat spreader lids 241-243, while also providing a compression-compliant layer to protect the die from damage during any compression in the encapsulation process. Suitable thermal interface materials may be systems that include compliant, thermally conductive grease or non-curing silicone materials, or compliant, thermally conductive curable silicones or other types of polymeric systems, to minimize the thermal resistance between the die and the heat spreader lids, and to protect the die from damage during encapsulation.

Figure 5:
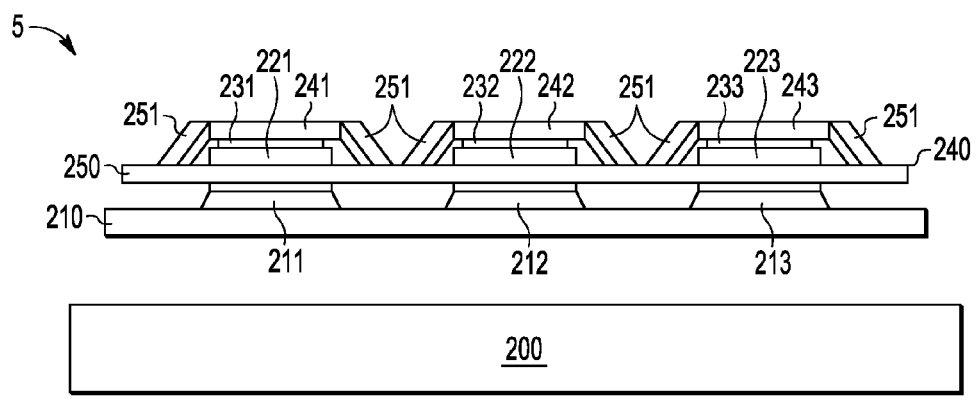
FIG. 5 illustrates a side view of the upset/downset heat spreader lids affixed to the integrated circuit die mounted on the carrier substrate prior to placement in the lower mold packaging die.

The connection of the die array to the upset/downset heat spreader lid array 240 is shown in FIG. 5 which illustrates a side view 5 of the upset/downset heat spreader lid array 240 that is affixed via patterned TIM layers 231-233 to the integrated circuit die 221-223 for placement in the lower mold packaging die 200. In this way, the patterned TIM layers 231-233 on each die 221-223 provide direct thermal contact between the die and the corresponding heat spreader lids 241-243 once the die on carrier substrate panel 210 are pressed into contact with the heat spreader lid array 240. As depicted, the lateral dimensions of each heat spreader lid 241-243 completely cover the entire upper surface of the corresponding integrated circuit die 221-223. In addition, the downset connection spars 251 are positioned to align with the intended saw singulation scribe line.

Figure 6:
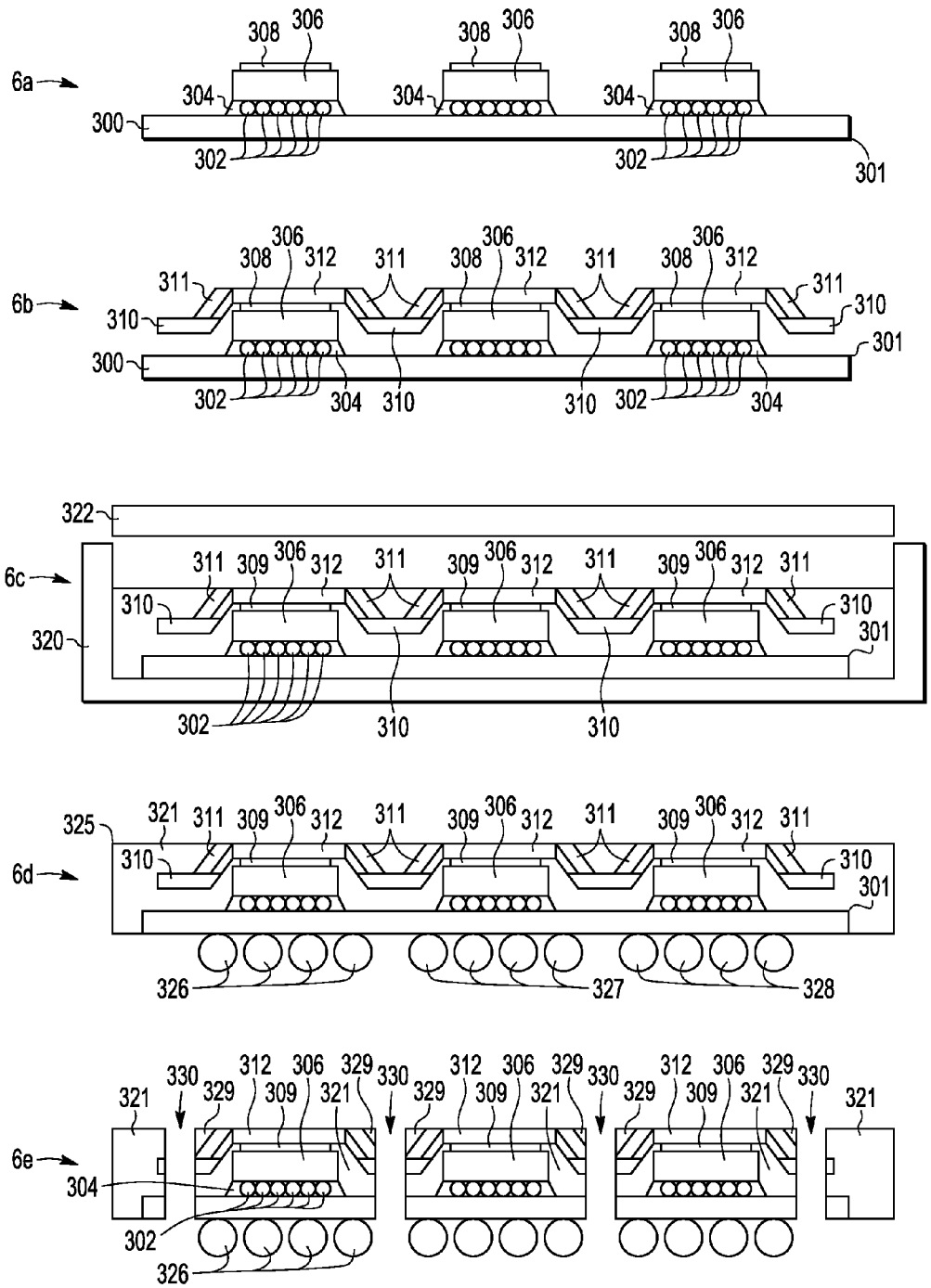
FIG. 6 is a diagrammatic depiction of various manufacturing process steps which may be used to form a thermally enhanced flip chip integrated circuit heat spreader lid packages in accordance with various embodiments of the present invention.

To illustrate an example of how the heat spreader lid array structure may be used in a compression molding process to encapsulate a plurality of integrated circuit die arranged on a carrier substrate in a matrix array, reference is now made to FIG. 6 which shows diagrammatic depiction of various manufacturing process steps which may be used to form thermally enhanced flip chip integrated circuit heat spreader lid packages from a plurality of mold array packages formed by attaching and encapsulating a substrate array portion 300, 302, 304, 306, 308 and heat spreader lid array portion 311 to form an encapsulated substrate array 325 with exposed heat spreader lids 312.

As depicted in FIG. 6*a*, a molded array package (MAP) carrier substrate 300 is provided having a plurality of single semiconductor dies 306 that have been inspected and attached in an array configuration to a carrier substrate 300 using flip chip bumps (302) or other appropriate die attach method, and underfill material (304). The IC die 306 may be any type of integrated circuit device, such as a microprocessor, digital signal processor (DSPs), or an analog device, memory, or circuits that perform any other type of function. Thus, the IC die 306 is not limited to a particular technology (such as CMOS) or derived from any particular wafer technology. Also, a variety of different die sizes can be accommodated with the heat spreader array structure described herein. The underfill material 304 may be any suitable underfill material, such as a filled epoxy, a thermoplastic adhesive, silicon material, or the like. Such underfill materials are well known to those of skill in the art. In some embodiments, a specific underfill material may not be used, and the mold compound fills in the space under each die during encapsulation. The IC die 306 may also be electrically connected to conductors in the base carrier/die flag structure 300 via a plurality of conductors, such as flip-chip bump conductors 302 formed between the IC die 306 and contact pads on substrate 300. Though not depicted, the flip-chip bump conductors 302 may be formed in rows and columns for making electrical contact between the base carrier 300 and IC die 306.

In addition, one or more patterned thermal interface material layers 308 may be selectively formed or applied on an exposed surface of each die 306 using a compliant, thermally conductive grease or non-curing silicon material to minimize the thermal resistance between the die and the subsequently attached heat spreader lid array, and to protect the die from compression-related damage.

As shown in FIG. 6*b*, a single lead frame heat spreader lid array 310 is formed with thermally conductive material such as, for example, copper (e.g., CDA194 copper) or other copper alloy, nickel iron alloy (e.g., Alloy 42) or other Ni alloys, and the like. The depicted heat spreader lid array 310 is placed in registry with and attached to the plurality of integrated circuit dies 306 using the patterned thermal interface material layer(s) 308 as a thermally conductive adhesive layer, with TIM material used to secure the heat spreader array until permanent attachment of lid array to dies during encapsulation. In selected embodiments, the heat spreader lid array 310 may be formed as a non-planar array of upset heat spreader lids 312 which are positioned in an array for alignment with the integrated circuit die 306 and are attached to spars 311 and to an external spar frame (not shown) using connection spars 311. In other embodiments (not shown), the heat spreader lid array 310 may be formed as a planar array of heat spreader lids connected together by connection spars. In still other embodiments, the thermal interface material (TIM) 308 may be a film or tape and applied to the bottom surface of each heatspreader in the array 310, with TIM then making contact with top of integrated circuit die 306 when heatspreader array 310 is aligned and placed in registry.

Subsequently (as shown in FIG. 6*c*), the assembled heat spreader lid array 310 and MAP carrier substrate 301 are placed in an encapsulation mold system 320, 322 and encapsulated with mold compound 321 so as to leave exposed an upper surface of the (upset) heat spreader lids 312. For example, the assembled heat spreader lid array 310 and MAP carrier substrate 301 may be compressed between a lower mold die tool 320 and an upper mold die tool 322 so that the upper mold die tool 322 is compressed against the upper surface of the (upset) heat spreader lids 312. Alternatively, the upper mold die tool 322 and heat spreader lid array 310 may be attached (e.g., by vacuum) and compressed together against the lower mold die tool 320 and assembled heat spreader lid array 310. As a result, the patterned TIM layers 308 may be compressed and expand laterally to form compressed TIM layers 309 which cover the entirety of the die 306. The substrate carrier, die, and heat spreader assembly are then encapsulated with mold compound 321 using any desired technique, such as cavity injection molding or compression molding. With the upper mold die tool 322 pressed against the upset heat spreader lids 312 of the array 310, the mold compound material 321 is cured to encapsulate the downset portions and spars 311 of the heat spreader array 310, as well as the exposed surfaces of the integrated circuit dies 306, underfill 304, and carrier substrate 300. However, when the upper mold die tool 322 is removed, the upset heat spreader lids 312 are exposed and not covered with mold compound material, thus providing optimal heat transfer or interface to external heatspreader.

To ensure that the integrated circuit die 306 make direct thermal contact to the heat spreader lid array 310 via the TIM layers 308, 312, the vertical or height dimensions of the mold cavity formed between the compressed lower and upper mold die tools 320, 322 are controlled or specified to be equal to, or slightly less than, the combined height of the MAP carrier substrate assembly 301, including the carrier substrate 300, die-to-substrate interconnect height enclosed by the underfill 304, integrated circuit die 306, and TIM layer(s) 308. And by using a compressible or compliant TIM layer 308, the exertion of downward mold clamp force to compress the upper mold die tool 322 against the heat spreader array 310 causes the integrated circuit die 306 to make direct thermal contact with the heat spreader array 310 without exerting excessive compression forces that could damage or crack the integrated circuit die 306, and without exerting insufficient compression forces that would allow mold compound to bleed or flash on the top surface of the upset heat spreader lids 312. The use of a compressible or compliant TIM layer 308 also effectively absorbs thickness variability in the components 302, 304, 306 of the MAP carrier substrate assembly 301 which can create problems when performing encapsulation molding in an encapsulation mold system 320, 322 having fixed mold cavity dimensions. Thickness variability attributed to the carrier substrate 300 may also be addressed by using an upper mold die tool (not shown) having a cavity opening defined by an outer seal ring that may be pressed directly against the upper surface of the carrier substrate 300. A further alternative approach for accommodating height variation of the components in the system is the use of a protective mold film held against the upper mold die when using cavity injection molding. This polymer-based film of approximately 50 um thickness protects the upper mold die and enables easy release of the molded array from the mold die. The film would provide a certain level of compliancy to add to that provided by the TIM material, further reducing risk of damage to the integrated circuit 306.

Subsequent processing steps may include a post mold cure of the mold compound, laser marking steps, formation of ball grid array conductors on the carrier substrate, package singulation into individual elements, cleaning, and inspection. For example, FIG. 6d shows the substrate array 325 formed with the encapsulated heat spreader lid array 310 and MAP carrier substrate 301 after removal from the encapsulation mold system and post mold curing steps. In addition, ball grid array conductors 326-328 are shown as being formed on the exposed surface of the substrate array 325 to be electrically connected via conductive traces (not shown) formed in the carrier substrate 300 to the integrated circuit die 306.

Subsequent to compression molding and initial curing of the mold compound 321, individual packaged devices are singulated with a saw or laser or other cutting device 330 that is applied to the mold array packages along the saw cut lines or scribe grids defined by the downset connection spars 311 and non-circuit portions of carrier substrate 300. As illustrated in FIG. 6e, saw cut lines 330 are positioned for separating individual packaged die 306 by cutting down through the mold compound and the downset connection spars 311 which are formed and positioned to minimize the heatspreader material from the saw singulation path, thereby increasing throughput and extending saw blade life. Depending on the width of the saw cut lines, the individual packages may leave mold compound corner regions 329 at the top peripheral side end of each singulated package, thereby covering the exposed downset connection spars 311 to prevent delamination and reduce burrs from the cut spar edges.

After singulation, the integrated heat spreader lid 312 in each singulated device will provide an external heat dissipation surface to efficiently and directly convey heat from the packaged integrated circuit 306 through the TIM layer 309 and heat spreader lid 312. The final metal finish in the exposed integrated heat spreader lid 312 can be plated with Ni or NiPd or other commonly used finishes used to promote adhesion and provide suitable marking surface and aesthetic value.

As described herein, the integrated heat spreader lid array is provided as an n×m (n>1, m≥1) array or matrix of low profile, low cost heat spreader lids which can be fabricated by means commonly used to make lead frames (etching, stamping, coining, or machining followed by plating of final finish). The low profile array of heat spreader lids may be applied together for direct attachment to a corresponding array of IC die that are encapsulated with use of low pressure compression molding. With the heat spreader lid being exposed to the ambient environment on the top and side package surfaces, the integrated circuit packages are provided with a substantial surface area for the dissipation of heat away from the IC die. With improved thermal performance, the power capability of the integrated circuit packages can be increased, and/or the temperature of the semiconductor packages can be reduced. Thus, selected embodiments provide an inexpensive method for volume production of reliable and thermally enhanced integrated circuit packages that can be implemented using current semiconductor assembly equipment.

Figure 7:
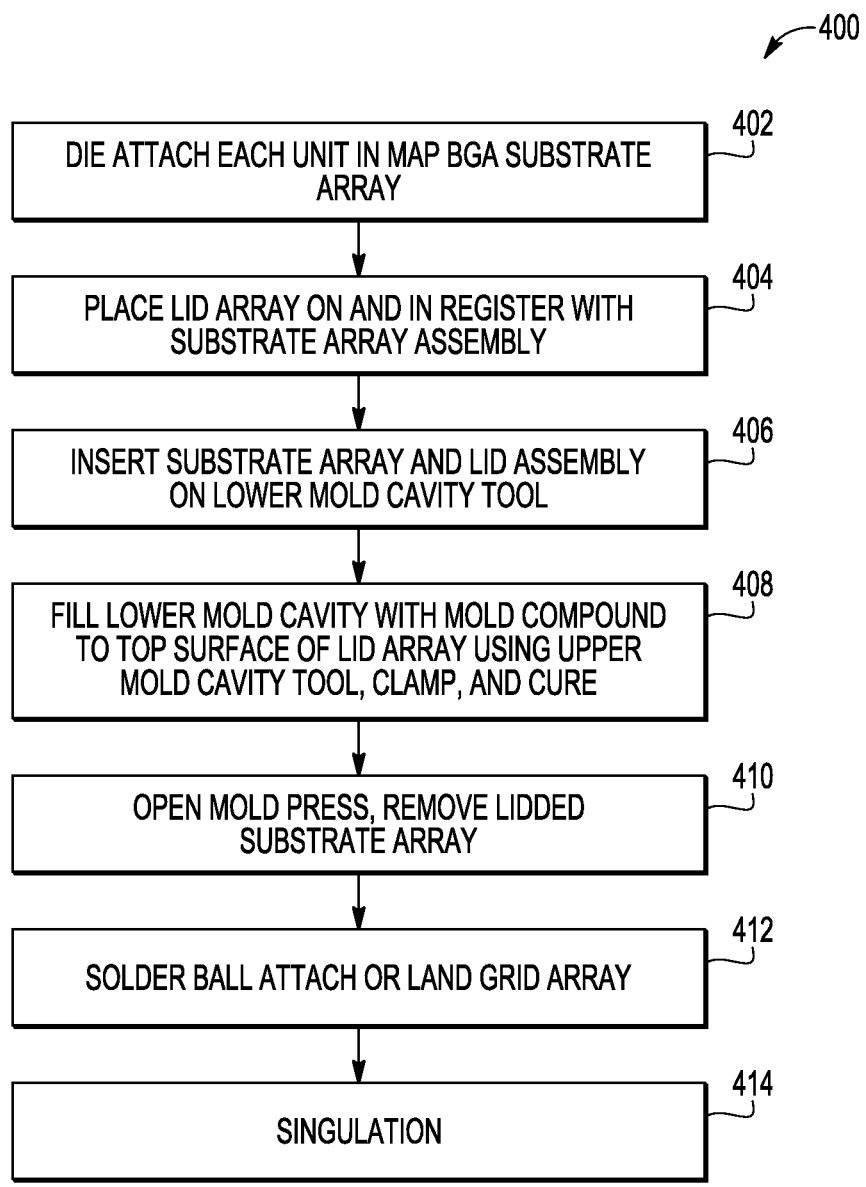
FIG. 7 illustrates an example flow chart depicting a process of fabricating thermally enhanced integrated circuit heat spreader lid packages using a heat spreader lid array in accordance with selected embodiments of the present invention.

Turning now to FIG. 7, there is illustrated an example flow chart sequence 400 depicting a process of fabricating thermally enhanced integrated circuit lid heat spreader packages using a heat spreader array in accordance with selected embodiments of the present invention. The process begins at step 402 when a substrate array is assembled by attaching a plurality of integrated circuit die in an array or matrix pattern using flip-chip attach methods to a molded array package (MAP) substrate, such as a ball grid array (BGA) substrate. At step 404, a heat spreader lid array having a plurality of lids formed in a planar or upset layer is assembled in registry with the substrate array so as to make direct thermal contact to the top die surface through a patterned, thermally conductive, compliant layer having a maximum thickness. The assembled substrate/heat lid spreader array is then inserted into a lower mold cavity tool (step 406) and an upper mold cavity tool is compressed against the plurality of lids while the mold cavity is filled with mold compound up to, but not over, the plurality of lids (step 408). The mold compound may be provided by melting mold compound material or dispensing a liquid mold compound or injecting mold compound in the mold tool cavity. The cured mold compound provides a permanent attachment between the lid array and integrated circuit die on the substrate array, forming a lidded substrate array. Upon initial curing, the mold press can be opened to remove the lidded substrate array (step 410). At this point, solder ball conductors may be attached to the substrate (step 412), though solder ball conductors are not required for land grid array (LGA) surface-mount packaging applications. Finally, the lidded substrate array may be singulated into individual integrated circuit packages (step 414), such as by using saw singulation. At this point, the individual integrated circuit packages may be placed in a tray and sent for inspection and testing.

By now it should be appreciated that there is provided herein a method of making a plurality of integrated circuit packages. In the disclosed methodology, a substrate array is provided that includes a plurality of integrated circuit die having a first surface attached to a first surface of the substrate array and having a thermally conductive interface layer formed on a second surface of each integrated circuit die. In selected embodiments, the thermally conductive interface layer may be formed by applying a patterned layer of compliant, thermally conductive grease or non-curing silicon material to the second surface of each integrated circuit die. In addition, a leadframe heat spreader lid array is provided that includes multiple heat spreader lids having planar upper lid surfaces connected together by connection spars to define one or more openings between adjacent heat spreader lids defining singulation cut areas around each head spreader lid. In selected embodiments, the heat spreader array may be provided by selectively etching, machining, or stamping a metal layer to define a planar leadframe heat spreader lid array with the plurality of heat spreader lids and connection spars formed in a single planar layer. In other embodiments, the heat spreader array may be provided as a plurality of upset heat spreader lids connected together by a plurality of downset lead finger spars to define the one or more openings between adjacent heat spreader lids. Each of the upset heat spreader lids may be sized to make contact with a corresponding integrated circuit die through the thermally conductive interface layer formed thereon. The leadframe heat spreader lid array is attached to the IC die on the substrate array by pressing the leadframe heat spreader lid array into contact with the thermally conductive interface layer formed on each integrated circuit die to make direct contact therebetween. In selected embodiments, the leadframe heat spreader lid array is attached by pressing an upper mold cavity tool against a lower mold cavity tool and against the planar upper lid surfaces of the leadframe heat spreader lid array to form a mold cavity between the upper and lower mold cavity and to attach the heat spreader lid array into contact with the thermally conductive interface layer formed on each integrated circuit die. Prior to pressing the upper mold cavity tool against the lower mold cavity tool, an interior surface of the upper mold cavity may be lined with a polymer film to prevent mold compound from encroaching on the top surface of the heat spreader array and to help accommodate fabrication tolerances by absorbing any thickness variability in the height of the lid/integrated circuit die/carrier substrate assemblies. Once attached, the plurality of integrated circuit die and the heat spreader lid array are encapsulated with mold compound except for the planar upper lid surfaces of the plurality of heat spreader lids and bottom surface of the substrate array. The mold compound is then cured, resulting in an array of molded packages, each having a portion of the substrate array exposed on a first side and a planar upper lid surface of a heat spreader lid exposed on a second side. The mold encapsulation process may include filling the mold cavity with a mold compound except for the planar upper lid surfaces of the plurality of heat spreader lids, followed by heating or curing the mold compound. Subsequently, ball grid arrays may be formed on the exposed surface of the substrate array to be electrically connected to conductive traces formed in the substrate array, and/or the array of molded packages may be singulated into a plurality of integrated circuit packages.

In another form, there is provided semiconductor package and associated method of fabrication. As disclosed, the semiconductor package includes a substrate having first and second surfaces attached to a die having first and second surfaces, where the first surface of the die is flip-chip bonded to the first surface of the substrate. There may also be an array of solder balls attached to the second surface of the substrate to make electrical connection to the die via conductive traces formed in the substrate. The semiconductor package also includes a thermally conductive interface layer formed to cover the second surface of the die, where the thermally conductive interface layer may be formed as patterned layer of compliant, thermally conductive grease or non-curing silicon material. In addition, the semiconductor package includes a heat spreader lid formed with a thermally conductive layer of copper, nickel or an alloy thereof. As formed, the heat spreader lid has an exposed heat dissipation surface layer having a thermal contact surface that is at least as large as the second surface of the die, and a plurality of connection spars extending laterally from the exposed heat dissipation surface layer, where the exposed heat dissipation surface layer is positioned to make contact to the thermally conductive interface layer and is positioned apart from the substrate to define an encapsulation molding region in which encapsulation mold compound material is formed to seal or permanently attach the substrate and heat spreader lid. In selected embodiments, the connection spars extend laterally to be co-planar with the exposed heat dissipation surface layer, while in other embodiments, the connection spars extend laterally as downset connection spars that are not co-planar with the exposed heat dissipation surface layer. Thus, selected embodiments form the plurality of connection spars to be embedded and surrounded by the encapsulation mold compound material except at peripheral side ends of the semiconductor package.

In yet another form, there is disclosed a method of making a semiconductor package. As an initial step, a plurality of integrated circuit die is attached to a molded array package substrate array using flip-chip bonding to enable electrical connection between each integrated circuit die and conductors in the substrate array. A heat spreader lid array is also provided that is formed with an unlaminated thermally conductive material to define a plurality of heat spreader lids positioned for alignment with the plurality of integrated circuit die, where each heat spread lid comprises an exposed heat dissipation surface layer and a plurality of connection spars extending laterally from the exposed heat dissipation surface layer. In selected embodiments, the heat spreader lid array is formed by selectively etching, machining, or stamping a metal layer to define a planar leadframe heat spreader lid array with each exposed heat dissipation surface layer and connection spars extending laterally and formed in a single planar layer with said exposed heat dissipation surface layer. In addition, a thermal interface material layer is formed on an exposed surface of each of the plurality of integrated circuit die or on a bottom surface of each exposed heat dissipation surface layer. By placing or pressing the heat spreader lid array into direct thermal contact with the plurality of integrated circuit die using the thermal interface material layers, an area or region to be encapsulated is defined between the exposed heat dissipation surface layers and the substrate array. The encapsulation region may be filled with encapsulation mold compound material without covering the exposed heat dissipation surface layers with encapsulation mold compound material, followed by curing the mold compound material to encapsulate the plurality of integrated circuit die and to seal and permanently attach the substrate array and heat spreader lid array. As a result, an array of molded packages is formed, each having a portion of the substrate array exposed on a first side and a portion of the heat spreader lid array exposed on a second side. Finally, the array of molded packages may be singulated into a plurality of integrated circuit packages.

Although the described exemplary embodiments disclosed herein are directed to various packaging assemblies and methods for making same, the present invention is not necessarily limited to the example embodiments which illustrate inventive aspects of the present invention that are applicable to a wide variety of packaging processes and/or devices. Thus, the particular embodiments disclosed above are illustrative only and should not be taken as limitations upon the present invention, as the invention may be modified and practiced in different but equivalent manners apparent to those skilled in the art having the benefit of the teachings herein. For example, the methodology of the present invention may be applied using materials other than expressly set forth herein. In addition, the process steps may be performed in an alternative order than what is presented. Also, the figures do not show all the details of connections between various elements of the package, since it will be appreciated the leads, vias, bonds, circuit traces, and other connection means can be used to effect any electrical connection. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A semiconductor package, comprising:
   a substrate having first and second surfaces;
   a die having first and second surfaces, where the first surface of the die is flip-chip bonded to the first surface of the substrate;
   a compressed, laterally expansive, thermally conductive interface layer formed to cover the second surface of the die; and
   a heat spreader lid comprising an exposed heat dissipation surface layer and a plurality of connection spars extending laterally from the heat dissipation surface layer, where the heat dissipation surface layer contacts the compressed, laterally expansive, thermally conductive interface layer and is positioned apart from the substrate to define an encapsulation molding region in which encapsulation mold compound material is located to permanently attach the substrate, die, and heat spreader lid, wherein
   the heat spreader lid comprises an etched, machined, or stamped metal layer defining an upset heat spreader lid having a plurality of downset lead finger spars to define one or more singulation cut area openings around the heat spreader lid.

2. The semiconductor package of claim 1, where the plurality of connection spars extend laterally as downset connection spars that are not co-planar with the exposed heat dissipation surface layer.

3. The semiconductor package of claim 1, where the heat spreader lid is formed with a thermally conductive layer of copper, nickel or an alloy thereof.

4. The semiconductor package of claim 1, where the exposed heat dissipation surface layer has a thermal contact surface that is at least as large as the second surface of the die.

5. The semiconductor package of claim 1, further comprising an array of solder balls attached to the second surface of the substrate to make electrical connection to the die via conductive traces formed in the substrate.

6. The semiconductor package of claim 1, where the plurality of connection spars are embedded and surrounded by the encapsulation mold compound material except at peripheral side ends of the semiconductor package.

7. A semiconductor device, comprising:
   a substrate array;
   a plurality of integrated circuit die attached to the substrate array, each integrated circuit die having a first surface that is attached to a first surface of the substrate array using flip chip bumps and a second, opposed surface;
   a plurality of compressed thermally conductive interface layers attached, respectively, to each second, opposed surface of each integrated circuit die;
   a heat spreader lid array comprising a plurality of heat spreader lids having planar upper lid surfaces connected together by connection spars to define one or more singulation cut area openings around each head spreader lid, the heat spreader lid array attached to the plurality of compressed thermally conductive interface layers to form a compressed thermally conductive interface layer which completely covers each second, opposed surface of each integrated circuit die to provide direct contact between each integrated circuit die and the heat spreader lid array, wherein
   the heat spreader lid array comprises an etched, machined, or stamped metal layer defining a plurality of upset heat spreader lids connected together by a plurality of downset lead finger spars to define the one or more openings between adjacent heat spreader lids; and
   a mold compound package encapsulating the plurality of integrated circuit die and the heat spreader lid array except for the planar upper lid surfaces of the plurality of heat spreader lids which are exposed through the mold compound package.

8. The semiconductor device of claim 7, further comprising a ball grid array attached to an exposed surface of said substrate array for electrical connection through the substrate array to the plurality of integrated circuit die.

9. The semiconductor device of claim 7, where the plurality of compressed thermally conductive interface layers comprises a thermally conductive, compliant adhesive layer that is applied to each second, opposed surface of each integrated circuit die.

10. The semiconductor device of claim 7, where the plurality of compressed thermally conductive interface layers comprises a patterned layer of compliant, thermally conductive grease that is applied to each second, opposed surface of each integrated circuit die.

11. The semiconductor device of claim 7, where the plurality of compressed thermally conductive interface layers comprises a patterned layer of compliant, thermally conductive non-curing silicon material that is applied to each second, opposed surface of each integrated circuit die.

12. A semiconductor package, comprising:
a substrate array;
a plurality of integrated circuit die attached to the substrate array, each integrated circuit die having a first surface that is attached to the substrate array and a second, opposed surface;
a plurality of compressed and compliant thermally conductive interface layers completely covering, respectively, each second, opposed surface of each integrated circuit die; and
a heat spreader lid array comprising a plurality of heat spreader lids connected together by connection spars, where a bottom surface of each heat spreader lid makes direct contact to the plurality of compressed and compliant thermally conductive interface layers, wherein the heat spreader lid array comprises an etched, machined, or stamped metal layer defining the plurality of heat spreader lids which are connected together by a plurality of downset lead finger spars to define one or more openings between adjacent heat spreader lids.

13. The semiconductor package of claim 12, further comprising a mold compound package encapsulating the plurality of integrated circuit die and the heat spreader lid array except for a planar upper surface of each heat spreader lid which remains exposed through the mold compound package.

14. The semiconductor package of claim 12, where the plurality of integrated circuit die are attached to the substrate array using flip-chip bonding to enable electrical connection between each integrated circuit die and conductors in the substrate array.

15. The semiconductor package of claim 12, where the heat spreader lid array comprises an unlaminated thermally conductive material defining the plurality of heat spreader lids positioned for alignment with the plurality of integrated circuit die, where each heat spread lid comprises an exposed heat dissipation surface layer and a plurality of connection spars extending laterally from the exposed heat dissipation surface layer.

* * * * *